United States Patent
Amano

(10) Patent No.: US 6,803,990 B2
(45) Date of Patent: Oct. 12, 2004

(54) EXPOSURE APPARATUS AND PRESSURE CORRECTION METHOD

(75) Inventor: Toshitaka Amano, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/984,992

(22) Filed: Nov. 1, 2001

(65) Prior Publication Data

US 2002/0085184 A1 Jul. 4, 2002

(30) Foreign Application Priority Data

Nov. 6, 2000 (JP) ........................................ 2000-338002

(51) Int. Cl.⁷ .......................... G03B 27/52; G03B 27/42
(52) U.S. Cl. ............................... 355/30; 355/53; 355/55
(58) Field of Search .............................. 355/30, 53, 55

(56) References Cited

U.S. PATENT DOCUMENTS 4,737,823 A * 4/1988 Bouwer et al. ............... 355/53
5,025,284 A * 6/1991 Komoriya et al. ............ 355/53

* cited by examiner

Primary Examiner—Rodney Fuller
(74) Attorney, Agent, or Firm—Fitzpatrick, Cella, Harper & Scinto

(57) ABSTRACT

An exposure apparatus for projecting a pattern on a reticle onto a substrate via projection optics to expose the substrate to the pattern. The apparatus includes a focus detection system for detecting focus of the projection optics, a barometer for measuring at least one of atmospheric pressure and ambient air pressure within the apparatus, a calibration device for calibrating the focus detection system, and a correction device. The correction device acquires a correction quantity, for correcting for a change in an image-formation characteristic ascribable to a fluctuation in air pressure of the projection optics, based upon a result of a measurement performed by the barometer during execution of the calibration, and corrects operation of the calibration device using the correction quantity.

23 Claims, 12 Drawing Sheets

FLOW OF SEMICONDUCTOR DEVICE MANUFACTURING

EXPOSURE APPARATUS AND PRESSURE CORRECTION METHOD

FIELD OF THE INVENTION

This invention relates to an exposure apparatus and a method of correcting for air pressure. More particularly, the invention is suited to a projection exposure apparatus in which a correction is made for a fluctuation component of an image-formation characteristic that accompanies a fluctuation in atmospheric air pressure or ambient air pressure within the apparatus, thereby making it possible to achieve highly precise projection exposure.

BACKGROUND OF THE INVENTION

In a projection exposure apparatus used to manufacture a semiconductor device, a circuit pattern that has been formed on a mask or reticle is transferred to a photoresist layer on a wafer or glass plate, which serves as a photosensitive substrate, with a high degree of overlay precision. In order to accomplish this, it is required that the reticle and wafer be positioned (aligned) highly precisely.

Focus calibration is well known as a technique for making the focal point of the wafer agree with that of the reticle.

FIG. 1 is a schematic view illustrating the projection exposure apparatus having a focus calibration function based upon the TTL (Through The Lens) method. The apparatus shown in FIG. 1 includes a light source 1 for exposure. When a circuit pattern on a reticle 2 is transferred to a wafer 8 by exposing the wafer to the pattern, an exposure-apparatus control system 70 transmits a command to a light-source control system 30, and the operation of the light source 1 is controlled by a command from the light-source control system 30.

The reticle 2 is held on a reticle stage 4. A reticle reference plate 3 is held on the reticle stage 4, though there are instances where the plate 3 is secured at a position that is optically equivalent to that of the reticle 2.

In a scanning-type exposure apparatus, the reticle stage 4 is capable of being moved along the optic axis (z) of projection optics 5, and along axes (x, y) perpendicular to this axis, and is also capable of being rotated about the optic axis.

Control to drive the reticle stage 4 is carried out by sending a command from the exposure-apparatus control system 70 to a reticle-stage control system 40 and implementing control in accordance with a command from the reticle-stage control system 40.

Though not shown, several types of reference marks are provided on the reticle reference plate 3.

The projection optical system 5 is constituted by a plurality of lenses. When exposure is carried out, the image of the circuit pattern on the reticle 2 is formed on the wafer 8 at a magnification that corresponds to the reduction magnification of the projection optics 5. A projection optics control system 50 will be described later.

A projection optical system 6 and a detection optical system 7 form an off-axis autofocus optical system. The projection optical system 6 emits a non-exposure light beam that is condensed on a point on a stage reference plate 9 (or on the top of the wafer 8) and is reflected from this point. The reflected light impinges upon the detection optical system 7. Though not shown, a photoreceptor element for position detection is placed within the detection optical system 7 and the arrangement is such that the photoreceptor element and the light reflection point on the stage reference plate 9 will be conjugate points. Accordingly, a deviation in position along the optical axis of the projection optics 5 on the stage reference plate 9 is measured as a deviation in the position of the incident light beam on the position-detection photoreceptor element in the detection optical system 7.

A deviation in position from a predetermined reference plane of the stage reference plate 9 measured by the detection optical system 7 is transmitted to a wafer-stage control system 60. When focus calibration (described below) is measured, the wafer-stage control system 60 performs control to drive the stage reference plate 9 up or down along the optic axis (z direction) of the projection optics 5 in the vicinity of a predetermined reference position. The wafer-stage control system 60 also controls the position of the wafer 8 at the time of exposure.

Described next will be components for sensing the state of focus on the wafer 8 and driving a wafer stage 10 to detect the optimum focal point of the wafer 8 with respect to the reticle 2.

An image detection optical system 20 for focus calibration has elements 21, 22, 23, 24, 25, described later. Illuminating light emitted from a fiber 21 passes through a half-mirror 22 and is condensed in the vicinity of the reticle reference plate 3 (or reticle 2) via an objective lens 23 and mirror 24.

The illuminating light that has been condensed in the vicinity of the reticle reference plate 3 is condensed on the stage reference plate 9 via the projection optics 5. The top of the stage reference plate 9 is provided with reference marks (not shown) of several types. Light reflected from the stage reference plate 9 returns along the original optical path, traverses the projection optics 5, reticle reference plate 3, mirror 24 and objective lens 23 in the order mentioned, is reflected by the half-mirror 22 and impinges upon a position sensor 25.

The stage reference plate 9 is placed on the wafer stage 10 in a manner similar to that of the wafer 8. The stage reference plate 9 is fixed in a focal plane equivalent to that of the wafer 8.

The exposure-apparatus control system 70 manages the focal-point positions on the top surfaces of the wafer 8 and the stage reference plate 9 with respect to the projection optics 5, or the amount of focus offset between both surfaces and the projection optics 5.

The operation of a TTL-based focus calibration will now be described in detail.

FIG. 7 is a flowchart illustrating the sequence of focus calibration. With reference to FIGS. 1 and 7, the detection optical system 20 is focused coarsely on a reference mark on the reticle reference plate 3 (or on a mark on the reticle 2) (step S701). The purpose of step S701 is to focus the image detection optical system 20 on the mark of the reticle reference plate 3 (or reticle 2).

This will be described taking as an example a case in which the stage reference mark is measured while shifting the focal-point position of the stage reference mark at 100-nm intervals over a range of from −1439 nm to +361 nm.

First, the stage reference plate 9 is moved to a position at which the reference mark on the stage reference plate 9 can be observed by the image detection optical system 20 (step S702). The focal point of the stage reference mark is −1439 nm at step S702.

The procedure represented by steps (1) to (3) below (the loop of steps S703 to S705) is repeated until the focal-point position of the stage reference mark becomes +361 nm. In the repetition process, the value of the quantity of light or the contrast value that prevails when the focal point of the stage reference plate 9 is varied with respect to the projection optics 5 is measured. The measured value of the quantity of light or the measured contrast value is stored in association with the focal point of the stage reference plate 9 prevailing at the time of measurement.

(1) The reference mark is measured by the image detection optical system 20 (step S703).

(2) The focal point on the top surface of the stage reference plate 9 with respect to the projection optics 5 is measured by the autofocus detection system (the projection optical system 6 and detection optical system 7) (step S704). (It should be noted that the order of steps S703 and S704 may be reversed.)

(3) The focal point of the stage reference plate 9 with respect to the projection optics 5 is changed (step S705). More specifically, the stage reference plate is driven +100 nm from its present position.

On the basis of the value of the quantity of light or contrast value thus obtained by the foregoing measurement, an approximation calculation or center-of-gravity calculation is performed to compute the optimum focal-point position of the stage reference plate 9 (or wafer 8) with respect to the reticle reference plate 3 (or reticle 2) (step S706).

A method of correcting for a change in the image-formation characteristic that accompanies a change in air pressure will now be described with reference to FIG. 1.

As shown in FIG. 1, the exposure apparatus is provided with a barometer 80 for reading atmospheric air pressure or ambient air pressure within the apparatus. The pressure value read by the barometer 80 is transmitted to the exposure-apparatus control system 70.

The exposure-apparatus control system 70 calculates the amount of change in air pressure from the pressure value transmitted by the barometer 80 and exercises control so as to correct for the change in the image-formation characteristic if the amount of change in air pressure exceeds a predetermined quantity. There are four examples of methods of correction for dealing with a change in image-formation characteristic, namely (a) driving a movable stage along the optic axis of the projection optics 5, (b) driving a correction lens in the projection optics 5 along the optic axis, (c) changing over the wavelength of the light source, and (d) varying the scanning speed of the reticle stage 4. These four examples will now be described in brief.

In correction method (a) of driving the movable stage along the optic axis of the projection optics 5, the wafer-stage control system 60, which has received a command from the exposure-apparatus control system 70, subjects the wafer stage 10 to a correction by applying a drive command for moving the stage to a position that has been made to reflect an amount of correction for dealing with the change in the image-formation characteristic that accompanies the change in air pressure.

In correction method (b) of driving the correction lens of the projection optics 5 along the optic axis, the projection optics control system 50, which has received a command from the exposure-apparatus control system 70, subjects the correction lens (not shown) to a correction by applying a drive command for moving the lens to a position that has been made to reflect an amount of correction for dealing with the change in the image-formation characteristic that accompanies the change in air pressure.

In correction method (c) of changing over the wavelength of the light source, the light-source control system 30, which has received a command from the exposure-apparatus control system 70, subjects the exposure light source 1 to a correction by applying a drive command so as to change over the wavelength of the light source (not shown) to a wavelength that has been made to reflect an amount of correction for dealing with the change in the image-formation characteristic that accompanies the change in air pressure.

In correction method (d) of varying the scanning speed of the reticle stage 4, the reticle-stage control system 40, which has received a command from the exposure-apparatus control system 70, subjects the reticle stage 4 to a correction by applying a scanning drive command that causes an amount of correction, which is for dealing with the change in the image-formation characteristic that accompanies the change in air pressure, to be reflected in a scanning speed conforming to the ratio of the scanning speed of the reticle stage 4 to the scanning speed of the wafer stage 10.

In a correction method of varying the scanning speed of the wafer stage 10, the wafer-stage control system 60, which has received a command from the exposure-apparatus control system 70, subjects the wafer stage 10 to a correction by applying a scanning drive command that causes an amount of correction, which is for dealing with the change in the image-formation characteristic that accompanies the change in air pressure, to be reflected in a scanning speed conforming to the ratio of the scanning speed of the wafer stage 10 to the scanning speed of the reticle stage 4.

In a projection exposure apparatus used to manufacture a semiconductor device, a circuit pattern that has been formed on a mask or reticle is transferred to a photoresist layer on a wafer or glass plate, which serves as a photosensitive substrate, which a high degree of overlay precision. In order to accomplish this, it is required that the reticle and wafer be positioned (aligned) highly precisely.

Further, since progress is being made in reducing the line width of the circuit pattern formed, the focal depth is growing ever smaller.

Further, in the prior art, a correction is not applied with regard to short-term changes in air pressure, such as changes in air pressure that occur during measurement for focus calibration.

However, in view of the shorter focal depth and the need for high alignment precision, it is no longer possible to ignore a fluctuation in image-formation characteristic ascribable to a short-term fluctuation in air pressure.

Furthermore, since flexible manufacturing systems for the production of ASICs or the like are currently in vogue, there is a demand for higher throughput in a projection exposure apparatus. In the prior art, however, the appropriate correcting timing is not decided, nor is the correction method selected, from the point of view of throughput or correction precision. As a consequence, the apparatus is not always subjected to a correction by the optimum pressure correction method.

SUMMARY OF THE INVENTION

Accordingly, an object of the present invention is to provide an exposure apparatus and a method of correcting for air pressure in the exposure apparatus, in which a change in image-formation characteristic ascribable to a fluctuation in air pressure is corrected for and a correction method that makes the proper correction in the viewpoint of apparatus throughput or correction precision possible is realized.

According to the present invention, the foregoing object is attained by providing an exposure apparatus comprising: exposure means for repeatedly projecting a reticle pattern onto a substrate, which has been placed on a substrate stage, via projection optics to expose the substrate to the pattern; a focus detection system for detecting focus of the projection optics; a barometer for measuring at least one of atmospheric pressure and ambient air pressure within the apparatus; calibration means for calibrating the focus detection system; and correction means for acquiring a correction quantity, during execution of the calibration, which is for correcting for a change in image-formation characteristic ascribable to a fluctuation in air pressure of the projection optics, based upon a result of the measurement by the barometer, and a correction operation of the calibration means using the correction quantity.

According to another aspect of the present invention, the foregoing object is attained by providing an exposure apparatus comprising: exposure means for repeatedly projecting a pattern of a reticle, which has been placed on a reticle stage, onto a substrate, which has been placed on a substrate stage, via projection optics to expose the substrate to the pattern; a barometer for measuring at least one of atmospheric pressure and ambient air pressure within the apparatus; and correction control means for selecting one of a plurality of correction means for correcting for an amount of change of an image-formation characteristic ascribable to a fluctuation in air pressure, and correcting an exposure operation using a fluctuation in air pressure, which has been obtained as a result of measurement by the barometer, and the correction means that has been selected.

In still another aspect of the present invention, the foregoing object is attained by providing a method of correcting for a change in an image-formation characteristic ascribable to a fluctuation in air pressure in an exposure apparatus having exposure means for repeatedly projecting a reticle pattern onto a substrate, which has been placed on a substrate stage, via projection optics to expose the substrate to the pattern, a focus detection system for detecting focus of the projection optics, and a barometer for measuring at least one of atmospheric pressure and ambient air pressure within the apparatus, the method comprising: a calibration step of calibrating the focus detection system; and a correction step of acquiring a correction quantity, during execution of the calibration, which is for correcting for a change in image-formation characteristic ascribable to a fluctuation in air pressure of the projection optics, based upon a result of the measurement by the barometer, and correcting operation of the calibration step using the correction quantity.

In still another aspect of the present invention, the foregoing object is attained by providing a method of correcting for a change in an image-formation characteristic ascribable to a fluctuation in air pressure in an exposure apparatus having exposure means for repeatedly projecting a pattern of the reticle, which has been placed on a reticle stage, onto a substrate, which has been placed on a substrate stage, via projection optics to expose the substrate to the pattern, and a barometer for measuring at least one of atmospheric pressure and ambient air pressure within the apparatus, the method comprising: a correction control step of selecting one of a plurality of correction processes for correcting for an amount of change of an image-formation characteristic ascribable to a fluctuation in air pressure, and correcting an exposure operation using a fluctuation in air pressure, which has been obtained as a result of measurement by the barometer, and the correction process that has been selected.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Figure 1:
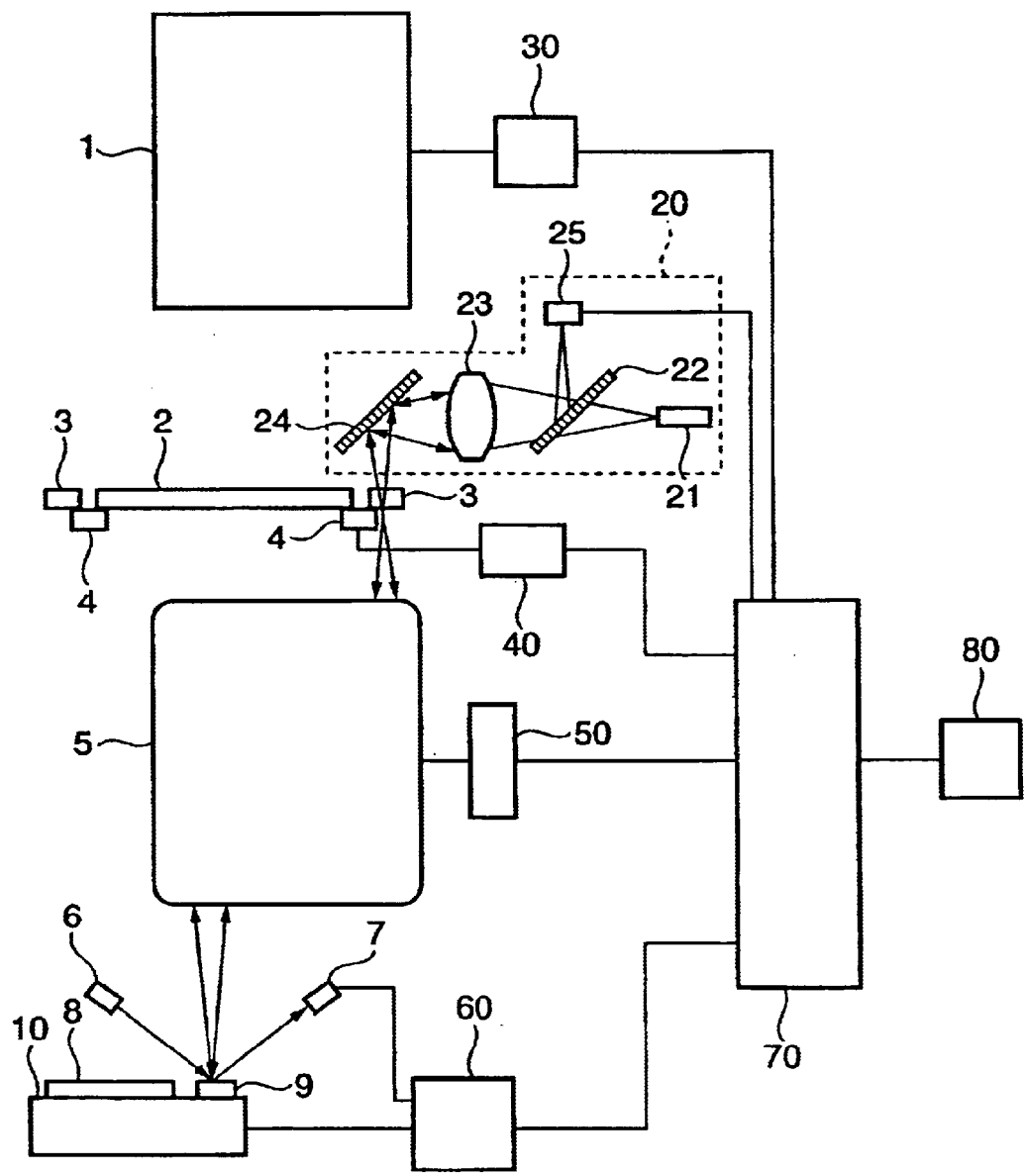
FIG. 1 is a schematic view illustrating a projection exposure apparatus having a focus calibration function based upon the TTL (Through The Lens) method in an embodiment of the present invention and in the prior art.

Preferred embodiments of the present invention will now be described in detail in accordance with the accompanying drawings.

In methods according to first to fifth embodiments of the present invention, described below, for correcting for a change in image-formation characteristic ascribable to a change in air pressure, a correction commensurate with the change in the air pressure, a correction commensurate with the change in the image-formation characteristic is carried out at least at the time of shot exposure or at the time of some other operation of the apparatus during measurement for focus calibration. The essentials of correction processing according to each embodiment will be described before the details of each embodiment are discussed.

(1) Correction during measurement for focus calibration.

In measurement for focus calibration, a mark on a movable stage, or the substrate surface, is observed while changing the position of a movable stage relative to the projection optics along the optic axis thereof, the value of the quantity of light or a value of contrast is measured and, at the same time, the focal-point position of the movable stage along the optic axis of the projection optics is measured. Furthermore, in a case where a correction that conforms to a change in the image-formation characteristic is carried out, the present value of air pressure is read in at the same time that the above-described measurement is performed. It should be noted that the term "movable stage" is the generic expression for a reticle stage and a wafer stage.

According to one embodiment of the measurement method, the amount of change in air pressure is obtained from the values of air pressure read in, this is converted to an amount of change in the focal-point position of the projection optics along the optic-axis, and the value obtained by the conversion is added to the focal-point position of the movable stage along the optic axis of the projection optics, this focal-point position being that which prevailed when the light-quantity value or contrast value was measured. Alternatively, the value obtained by the conversion may be reflected in the actual amount of drive of the movable stage or in the wavelength of the light source used in the measurement.

The optimum focal-point position is computed by an approximation calculation or center-of-gravity calculation using the light-quantity value or contrast value and the corrected focal-point position of the movable stage relative to the projection optics along the optic axis thereof, the position being that which prevailed when the light-quantity value or contrast value was measured. As a result, the calculated optimum focal-point position will take into account an amount of change in the image-formation characteristic ascribable to a short-term change in air pressure.

(2) Correction at time of shot exposure.

To make the correction at the time of shot exposure, the value of the air pressure is read in at regular intervals, the amount of change in the air pressure is calculated from the values of air pressure read in, and the amount of correction is calculated based upon the amount of change in the air pressure. Correction control means selects one of a plurality of correction methods, which have been prepared in advance, in accordance with conditions decided in advance, and corrects the image-formation characteristic based upon the calculated amount of correction and by the selected correction method.

The correction control means controls correction processing by automatically selecting a correction method, which conforms to conditions such as emphasis on throughput, emphasis on correction precision and emphasis on both throughput and correction precision, from the following correction methods:

driving the movable stage along the optic axis of the projection optics;

driving the correction lens of the projection optics along the optic axis;

changing over the wavelength of the light source; and changing the scanning speed of the movable stage.

As mentioned above, the movable stage refers to both the reticle stage and the wafer stage. Either or both of these stages may be adopted as the object of correction.

(3) Correction during apparatus operation.

To effect a correction during operation of the apparatus, an amount of change in the air pressure is obtained from the difference between the present value of the air pressure and the value of the air pressure that prevailed when drive was applied previously to correct for an amount of change in image-formation characteristic ascribable to a change in the air pressure, and the correction value is calculated based upon the amount of change in the air pressure. The correction control means selects one of a plurality of correction methods, which have been prepared in advance, in accordance with conditions decided in advance, and controls the correction of the image-formation characteristic based upon the calculated amount of correction and by the selected correction method.

In a manner similar to that when shot exposure is performed, the correction control means controls correction processing by automatically selecting a correction method, which conforms to conditions such as emphasis on throughput, emphasis on correction precision and emphasis on both throughput and correction precision, from the following correction methods:

driving the movable stage along the optic axis of the projection optics;

driving the correction lens of the projection optics along the optic axis;

changing over the wavelength of the light source; and changing the scanning speed of the movable stage.

As mentioned above, the movable stage refers to both the reticle stage and the wafer stage. Either or both of these stages may be adopted as the object of correction.

In preferred embodiments described below as first to third embodiments, the light-quantity value or contrast value is measured and, at the same time, the position of the movable stage relative to the projection optics along the optic axis thereof is measured and the present value of air pressure is read in.

The amount of change in air pressure is calculated from the present value of air pressure read in and the calculated amount of change is converted to a position of the movable stage relative to the projection optics along the optic axis thereof.

The relative position obtained by the conversion is added to the relative position of the movable stage with respect to the projection optics along the optic axis thereof, the latter relative position being that which prevailed when the light-quantity value or contrast value was measured. Alternatively, it may be so arranged that the calculated amount of change in air pressure is reflected in the actual amount of drive of the movable stage or in the wavelength of the light source used in measurement.

Calculation of optimum focal-point position can be implemented by an approximation calculation or center-of-gravity calculation using the light-quantity value or contrast value and the relative position of the movable stage with respect to the projection optics along the optic axis thereof, in which the relative position takes into account the amount of change in air pressure.

In a fourth embodiment, the value of the air pressure during shot exposure is read in at regular intervals by air-pressure monitoring means.

Correction control means for changing over the air correction method automatically calculates air pressure at the time of exposure based upon values of air pressure from the end of a single shot exposure to an instant just prior to the next shot exposure, and obtains the amount of change in air pressure. The correction control means automatically selects a correction method, which conforms to conditions such as emphasis on throughput, emphasis on correction precision and emphasis on both throughput and correction precision, from the following correction methods:

driving the movable stage along the optic axis of the projection optics;

driving the correction lens of the projection optics along the optic axis;

changing over the wavelength of the light source; and changing the scanning speed of the movable stage.

Thus, the correction control means controls correction processing by calculating the correction value based upon the selected correction method and the amount of change in air pressure obtained as described above.

In a fifth embodiment, the amount of change in air pressure is obtained by calculating the difference between the present value of air pressure and the value of air pressure that prevailed when drive was applied previously to correct for an amount of change in image-formation characteristic ascribable to a change in the air pressure during operation of the apparatus.

The correction control means automatically selects a correction method, which conforms to conditions such as emphasis on throughput, emphasis on correction precision and emphasis on both throughput and correction precision, from the following correction methods:

driving the movable stage along the optic axis of the projection optics;

driving the correction lens of the projection optics along the optic axis;

changing over the wavelength of the light source;

changing the scanning speed of the movable stage.

The correction control means calculates the correction value based upon the calculated amount of change in air pressure and by using the selected correction method, and controls correction processing.

The first to fifth embodiments will now be described in detail.

(First Embodiment)

FIG. 1 is a schematic view illustrating the major components of the first embodiment of the present invention. This diagram applies also to the second to fifth embodiments described below. An overview has already been described in the discussion of the prior art and need not be described again.

Figure 2:
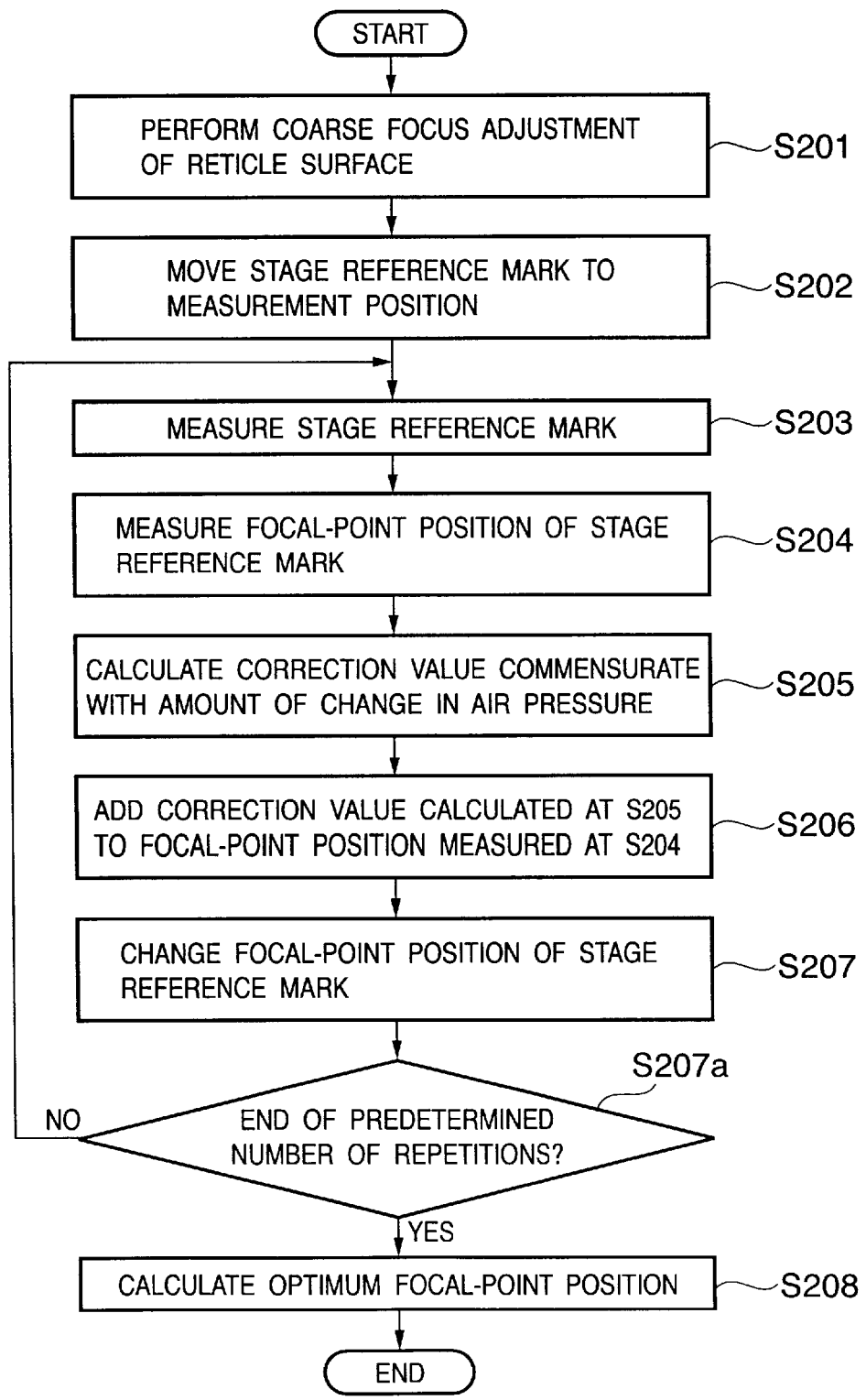
FIG. 2 is a flowchart illustrating a sequence for carrying out a pressure correction during a focus-calibration measurement according to a first embodiment of the present invention.

The first embodiment will now be described. FIG. 2 is a flowchart illustrating the processing sequence of focus calibration according to the first embodiment of the present invention. With reference to FIGS. 1 and 2, the focus of the detection optical system 20 is focused coarsely on a reference mark on the reticle reference plate 3 (or on a mark on the reticle 2) (step S201). The purpose of coarse focus adjustment is to focus the image detection optical system 20 on the mark of the reticle reference plate 3 (or reticle 2).

This embodiment will be described taking as an example a case in which the stage reference mark is measured while shifting the focal-point position of the stage reference mark at 100-nm intervals over a range of from −1439 nm to +361 nm.

Next, the stage reference plate 9 is moved to a position at which the reference mark on the stage reference plate 9 can be observed by the image detection optical system 20 (step S202). The focal point of the stage reference mark is −1439 nm at step S202.

The procedure (1) to (3) below (the loop of steps S203 to S207) is repeated until the focal-point position of the stage reference mark becomes +361 nm. In the repetition process, the focal-point position of the stage reference plate 9 with respect to the projection optics 5 is varied and the value of the quantity of light or the contrast value that prevails at each position is measured. The measured value of quantity of light or the measured contrast value is stored in association with the focal point of the stage reference plate 9 that prevailed at the time of measurement.

(1) The reference mark is measured by the image detection optical system 20 (step S203). It should be noted that measurement of the reference mark by the image detection optical system 20 means measuring the light-quantity value or contrast value of the reference mark.

(2) The focal point on the top surface of the stage reference plate 9 with respect to the projection optics 5 (the focal-point position of the stage reference mark) is measured by the autofocus detection system (the projection optical system 6 and detection optical system 7) (step S204). (It should be noted that the order of steps S203 and S204 may be reversed.)

(3) The amount of change in atmospheric air pressure or ambient air pressure within the apparatus is obtained by the barometer 80 and a correction value (amount of change) to be applied to the focal-point position is calculated from the amount of change in air pressure (S205).

(4) The amount of change in the focal-point position based upon the change in air pressure is added to the focal-point positions that was measured by the autofocus detection system (the projection optical system 6 and detection optical system 7) (step S206). The measured value (light-quantity value or contrast value) thus obtained and the corrected focal-point position are stored in memory (not shown) in corresponding form.

(5) The focal point of the stage reference plate 9 with respect to the projection optics 5 is changed (step S207). More specifically, the stage reference plate is moved +100 nm along the optic axis of the projection optics 5 from its present position.

On the basis of the information concerning the value of the quantity of light or contrast value thus obtained by the foregoing measurement processing (i.e., information concerning the measured value and focal-point position stored in memory), an approximation calculation or a center-of-gravity calculation is performed to compute the optimum focal-point position of the stage reference plate 9 (or wafer 8) with respect to the reticle reference plate 3 (or reticle 2) (step S208). That change in air pressure is not reflected in the target position to which the stage reference plate 9 is driven. Rather, a correction value commensurate with the amount of change in air pressure is stored beforehand and this correction value is used in the calculation of optimum focal-point position.

(Second Embodiment)

Figure 3:
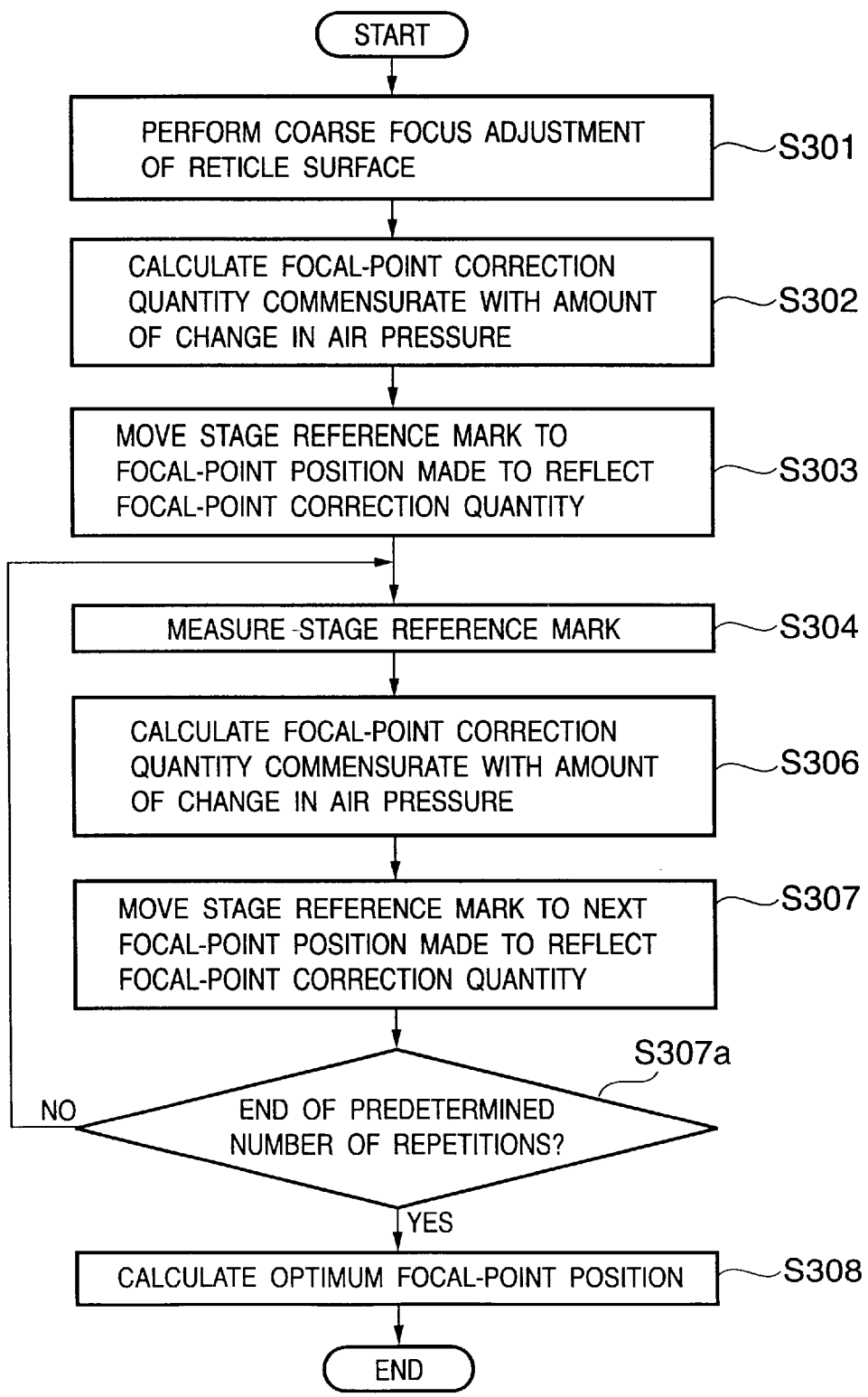
FIG. 3 is a flowchart illustrating a sequence for carrying out a pressure correction during a focus-calibration measurement according to a second embodiment of the present invention.

A second embodiment of the present invention will be described next. FIG. 3 is a flowchart illustrating the processing sequence of focus calibration according to the second embodiment of the present invention. With reference to FIGS. 1 and 3, the focus of the detection optical system 20 is focused coarsely on a reference mark on the reticle reference plate 3 (or on a mark on the reticle 2) (step S301). The purpose of coarse focus adjustment is to focus the image detection optical system 20 on the mark of the reticle reference plate 3 (or reticle 2).

As in the case of the first embodiment, the second embodiment will be described taking as an example a case in which the stage reference mark is measured while shifting the focal-point position of the stage reference mark at 100-nm intervals over a range of from -1439 nm to +361 nm.

Next, the amount of change in present atmospheric pressure or ambient air pressure within the apparatus is obtained and a focal-point correction quantity corresponding to the amount of change in air pressure is calculated (step S302). In this example, the amount of change in the focal-point position is assumed to be +11.01 nm.

The stage reference plate 9 is moved to a position at which the reference mark on the stage reference plate 9 can be observed by the image detection optical system 20, and the wafer stage 10 is moved to the focal point position that reflects the amount of correction in focal-point position calculated at step S302 (Step S303). In the case of this example, the focal point position at step S303 is −1439 nm+11.01 nm =1427.99 nm.

Next, the procedure (1) to (3) below (the loop of steps S304 to S307) is repeated (step S307a) until the focal-point position of the stage reference mark prior to air-pressure correction becomes +361 nm. At each repetition, the focal-point position of the stage reference plate 9 with respect to the projection optics 5 is changed and the light-quantity value or contrast value of the stage reference mark at each focal-point position is measured. The measured value and the focal-point position of the stage reference plate 9 that prevailed when the measurement was made are stored in corresponding form.

(1) The reference mark is measured by the image detection optical system 20 (step S304). It should be noted that measurement of the reference mark by the image detection optical system 20 means measuring the light-quantity value or contrast value of the reference mark. The measured value (light-quantity value or contrast value) thus obtained and the focal-point position prevailing at this time are stored in memory (not shown) in corresponding form.

(2) Next, the amount of change in present atmospheric pressure or ambient air pressure within the apparatus is obtained by the barometer 80. This is calculated in terms of an amount of change in the focal-point position, and the amount of correction in focal-point position is obtained (step S306).

(3) The focal-point position of the reference stage 9 with respect to the projection optics 5 is changed (step S307) while reflecting the amount of correction in the focal-point position calculated at step S306. More specifically, the stage reference plate is moved from its present focal-point position by a distance equal to 100 nm+the focal-point correction quantity obtained at step S306.

When the processing indicated by (1) to (3) above has been executed a predetermined number of times, control proceeds to step S308. Here the optimum focal-point position of the stage reference plate 9 (or wafer 8) with respect to the reticle reference plate 3 (or reticle 2) is calculated by an approximation calculation or center-of-gravity calculation based upon the light-quantity value or contrast value obtained by measurement (i.e., the information concerning the measured value and focal-point position stored in memory). Thus, the second embodiment differs from the first embodiment in that a correction value commensurate with the change in air pressure is reflected directly in the target position to which the stage reference plate 9 is driven.

Described next will be an offset generated when a correction commensurate with a change in air pressure is and is not applied during a focus-calibration measurement based upon the first and second embodiments.

Table 1 below illustrates the relationship between contrast values measured through focus-calibration measurement and wafer-stage focal-point positions, which prevail prior to correction for air pressure, at the time of contrast-value measurement.

TABLE 1

| FOCAL-POINT POSITION PRIOR TO AIR PRESSURE CORRECTION | CONTRAST VALUE |
|---|---|
| −1439 | 6.784 |
| −1339 | 7.176 |
| −1239 | 9.215 |
| −1139 | 11.96 |
| −1039 | 15.843 |
| −939 | 19.764 |
| −839 | 24.078 |
| −739 | 25.882 |
| −639 | 26.823 |
| −539 | 26.196 |
| −439 | 23.764 |
| −339 | 18.705 |
| −239 | 14.588 |
| −139 | 9.529 |
| −39 | 7.529 |
| 61 | 7.019 |
| 161 | 7.058 |
| 261 | 7.254 |
| 361 | 7.019 |

Table 2 below illustrates the relationship between contrast values measured through focus-calibration and wafer-stage focal-point positions, which prevail after correction for air pressure, at the time of contrast-value measurement.

TABLE 2

| FOCAL-POINT POSITION AFTER AIR PRESSURE CORRECTION | CONTRAST VALUE |
|---|---|
| −1427.99 | 6.784 |
| −1338.99 | 7.176 |
| −1255.99 | 9.215 |
| −1163.99 | 11.96 |
| −1062.99 | 15.843 |
| −966.985 | 19.764 |
| −866.985 | 24.078 |
| −725.987 | 25.882 |
| −615.987 | 26.823 |
| −511.987 | 26.196 |
| −408.987 | 23.764 |
| −309.987 | 18.705 |
| −207.987 | 14.588 |
| −105.987 | 9.529 |
| −6.987 | 7.529 |
| 90.013 | 7.019 |
| 193.013 | 7.058 |
| 290.013 | 7.254 |
| 392.013 | 7.019 |

In a case in which calculation of the optimum focal-point position is performed by carrying out a center-of-gravity calculation based upon the result of focus-calibration measurement in Table 1, the optimum focal-point position becomes −662 nm. This is the optimum focal-point position prior to the correction for air pressure.

In a case in which calculation of the optimum focal-point position is performed by carrying out a center-of-gravity calculation based upon the result of focus-calibration measurement in Table 2, the optimum focal-point position becomes −653 nm. This is the optimum focal-point position after the correction for air pressure.

Accordingly, if a correction commensurate with the change in air pressure during the execution of focus calibration is not carried out, the focal-point position will have an offset of 9 nm. Further, if the fluctuation in air pressure during focus calibration is large, the amount of offset is large.

(Third Embodiment)

Figure 4:
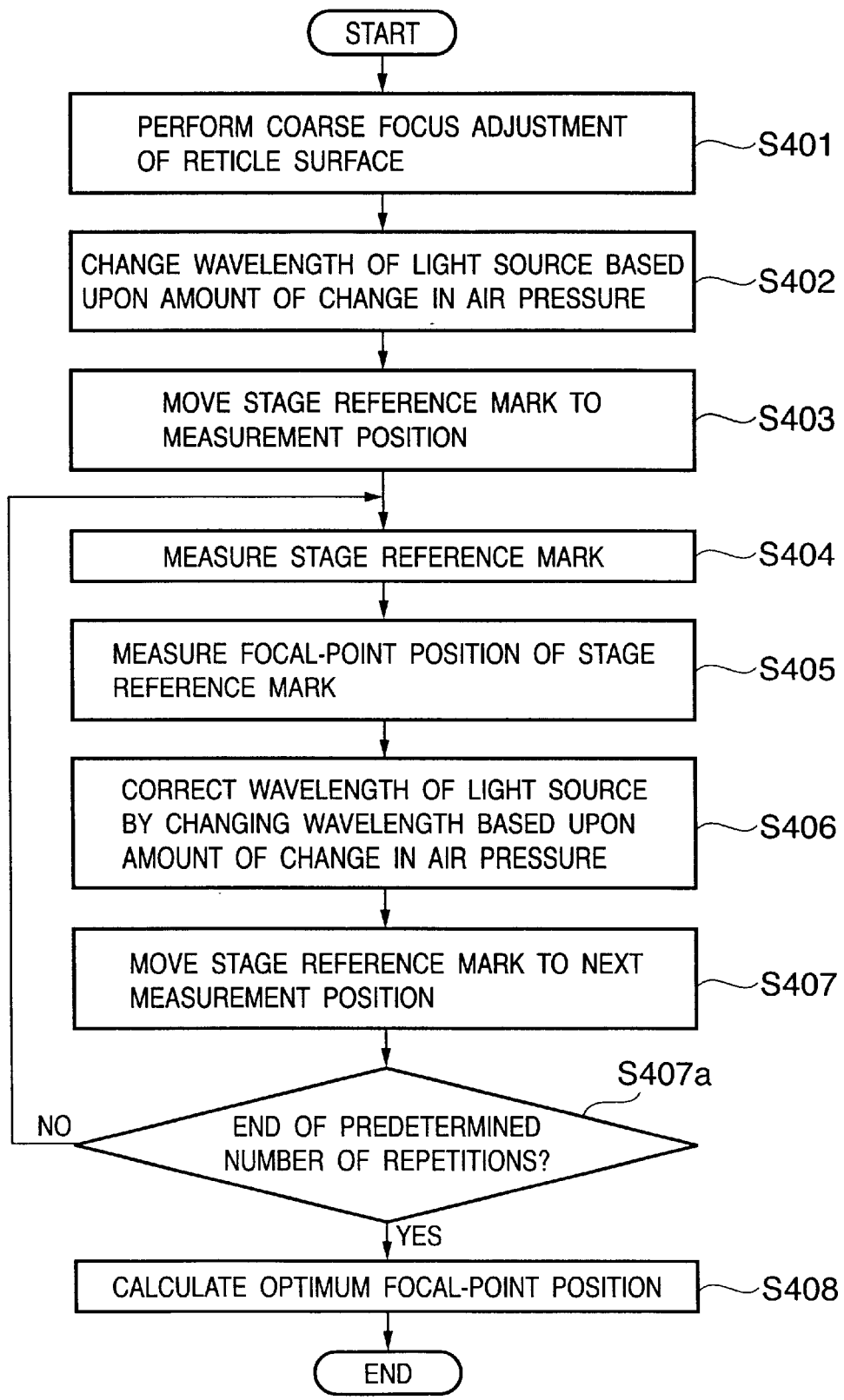
FIG. 4 is a flowchart illustrating a sequence for carrying out a pressure correction during a focus-calibration measurement according to a third embodiment of the present invention.

A third embodiment of the present invention will now be described. FIG. 4 is a flowchart illustrating the processing sequence of focus calibration according to the third embodiment of the present invention. With reference to FIGS. 1 and 4, the focus of the detection optical system 20 is focused coarsely on a reference mark on the reticle reference plate 3 (or on a mark on the reticle 2) (step S401). The purpose of coarse focus adjustment is to focus the image detection optical system 20 on the mark of the reticle reference plate 3 (or reticle 2).

This embodiment also will be described taking as an example a case in which the stage reference mark is measured while shifting the focal-point position of the stage reference mark at 100-nm intervals over a range of from −1439 nm to +361 nm.

When coarse focus adjustment of the reticle surface is completed, the amount of change in present atmospheric pressure or ambient air pressure within the apparatus is obtained and the wavelength of the image-detection light source is calculated based upon the amount of change in pressure. The wavelength of the image-detection light source is then changed over to the calculated wavelength (step S402).

Next, the wafer stage 10 is moved to a position at which the reference mark on the stage reference plate 9 can be observed by the image detection optical system 20 (step S493). The focal point of the stage reference mark is −1439 nm at the time of step S403.

The procedure (1) to (4) below (steps S404 to S407) is repeated until the focal-point position of the stage reference mark becomes +361 nm. At each repetition, the focal-point position of the stage reference plate 9 with respect to the projection optics 5 is changed and the light-quantity value or contrast value at each focal-point position is measured. The measured light-quantity value or contrast value and the focal-point position of the stage reference plate 9 that prevailed when the measurement was made are stored in corresponding form.

(1) The reference mark is measured by the image detection optical system 20 (step S404).

(2) The focal point on the top surface of the stage reference plate 9 with respect to the projection optics 5 is measured by the autofocus detection system (the projection optical system 6 and detection optical system 7) (step S405). (It should be noted that the order of steps S404 and S405 may be reversed.)

(3) The amount of change in air pressure is obtained from the present atmospheric pressure or ambient air pressure within the apparatus measured by the barometer 80, the amount of change in pressure is converted to wavelength of the image-detection light source, and the wavelength is changed over to the wavelength obtained by the conversion (step S406).

(4) The stage reference mark is moved to the next measurement position (step S407). More specifically, the focal-point position of the stage reference plate is moved +100 nm from its present position.

When the above-processing is executed a predetermined number of times, control proceeds to step S408. On the basis of the information concerning the value of the quantity of light or contrast value and focal-point position obtained by measurement, an approximation calculation or center-of-gravity calculation is performed to thereby compute the optimum focal-point position of the stage reference plate 9 (or wafer 8) with respect to the reticle reference plate 3 (or reticle 2) (step S408).

Thus, in accordance with the first to third embodiments as described above, it is possible to correct for a change in focal-point position that accompanies a short-term change in air pressure such as during the execution of focus calibration.

In the third embodiment, the wavelength of the light source is corrected based upon the amount of change in the air pressure. However, an arrangement may be adopted in which focus calibration is corrected by driving the correction lens based upon the amount of change in the air pressure.

It should be noted that an amount of change from a value of air pressure that prevailed when the image-formation characteristic was corrected previously based upon a change in air pressure may be used as the amount of change in atmospheric pressure or ambient air pressure within the apparatus in the first to third embodiments of the present invention. Accordingly, the amount of change may be the amount of change from the value of air pressure that prevailed when the wavelength was changed over previously or the amount of change from the value of air pressure that prevailed when the correction lens was driven previously.

(Fourth Embodiment)

Figure 5:
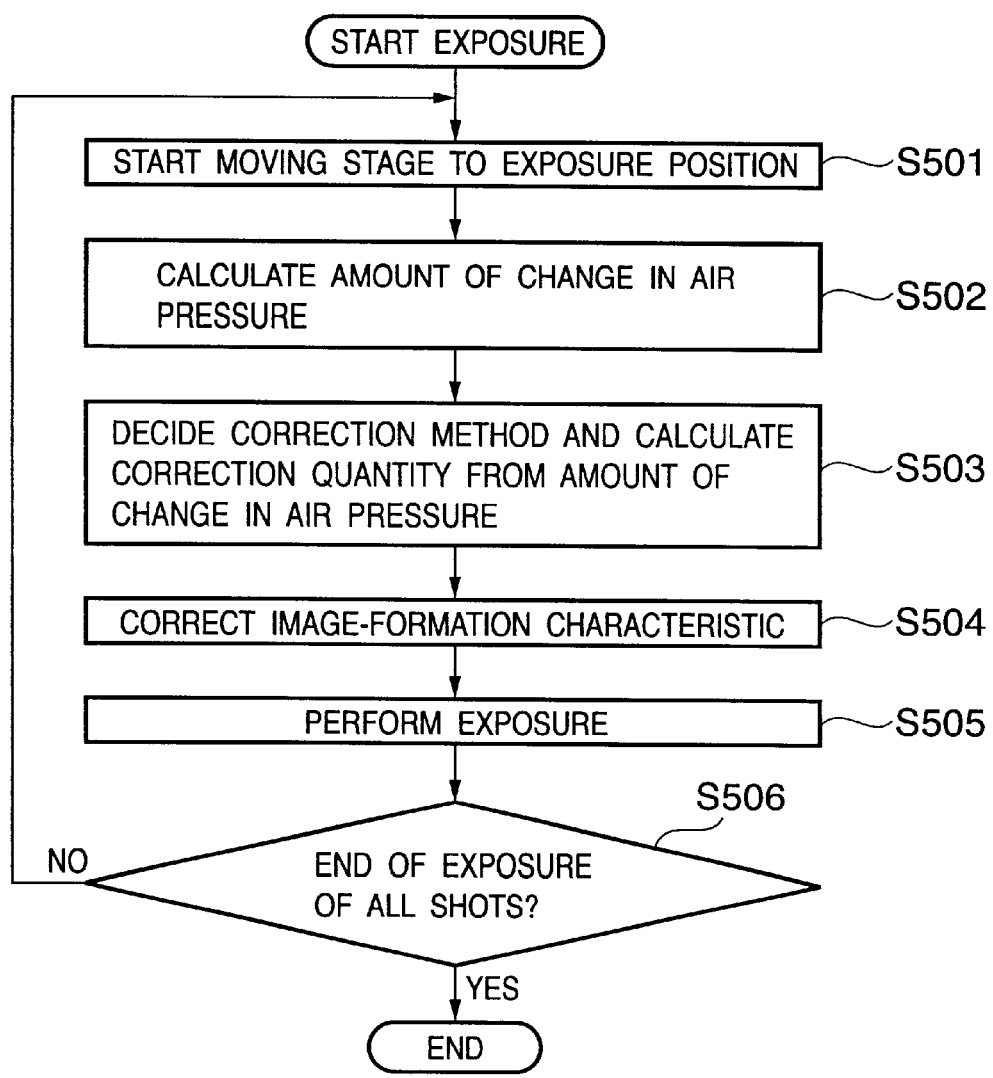
FIG. 5 is a flowchart illustrating a sequence for carrying out a pressure correction during exposure processing according to a fourth embodiment of the present invention.

A fourth embodiment of the present invention will now be described. In the fourth embodiment, compensation for fluctuation of the image-formation characteristic due to a change in air pressure is applied for every shot exposure. FIG. 5 is a flowchart illustrating the sequence of exposure processing according to the fourth embodiment of the present invention.

With reference to FIGS. 1 and 5, first the wafer stage 10 starts to be moved to the exposure position (step S501).

Next, the amount of change in atmospheric pressure or ambient air pressure within the apparatus is calculated during movement of the wafer stage 10 to the first shot exposure position (step S502). In this embodiment, the barometer 80 monitors air pressure by reading in values of air pressure over a fixed period of time. Values of air pressure over a fixed period of time (e.g., from the end of exposure of the previous shot to the end of movement to the exposure position of the next shot) may be read in beforehand by monitoring air pressure, and the difference between the average value of all values of air pressure read in and the value of air pressure that prevailed when air pressure was corrected previously may be used as the amount of change in atmospheric pressure or ambient air pressure within the apparatus. Alternatively, the difference between the average value and the value of air pressure that prevailed when the wavelength of the light source was changed over previously may be used, or the difference between the average value and the value of air pressure that prevailed when the correction lens was driven previously may be used.

Further, values of the air pressure over a fixed period of time (e.g., from the end of exposure of the previous shot to the end of movement to the exposure position of the next shot) may be read in by monitoring the air pressure, the value of the air pressure at the time of exposure of the next shot may be predicted from the state of fluctuation of all the air-pressure values read in, and the difference between the predicted value of the air pressure and the value of the air pressure that prevailed when the air pressure was corrected for previously may be adopted as the amount of change. Further, the difference between the predicted value of the air pressure and the value of the air pressure that prevailed when the wavelength of the light source was changed over previously may be adopted as the amount of change, or the difference between the predicted value of the air pressure and the value of the air pressure that prevailed when the correction lens was driven previously may be adopted as the amount of change.

Next, an amount of correction that corrects for the amount of change in image-formation characteristic ascribable to a change in air pressure is calculated based upon the calculated amount of change in air pressure and the method of correcting the image-formation characteristic is selected (step S503).

Four methods of correcting the image-formation characteristic are considered. They are as follows:
1. driving the movable stage along the optic axis of the projection optics (first correction method);
2. driving the correction lens of the projection optics along the optic axis (second correction method);
3. changing over the wavelength of the light source (third correction method); and
4. changing over the scanning speed of the movable stage (fourth correction method).

It should be noted that the "movable stage" refers to the reticle stage 4 or wafer stage 10. Either or both of these stages may be adopted as the object of correction.

Table 3 below is a summary of the four methods of correcting the image-formation characteristic from the standpoint of correction time and correction precision.

TABLE 3

| Correction Method | CORRECTION TIME | CORRECTION PRECISION |
|---|---|---|
| DRIVE MOVABLE STAGE ALONG OPTIC AXIS OF PROJECTION OPTICS | SHORT | ○ |
| DRIVE CORRECTION LENS OF PROJECTION OPTICS ALONG OPTIC AXIS | LONG | ⊙ |
| CHANGE OVER WAVELENGTH OF LIGHT SOURCE | LONG | ⊙ |
| CHANGE OVER SCANNING SPEED OF MOVABLE STAGE | SHORT | ○ |

Table 3 reveals that correction time is short for the method of driving the movable stage along the optic axis of the projection optics and for the method of changing over the scanning speed of the movable stage. However, the method of changing over the scanning speed of the movable stage is applicable only in a scanning-type exposure apparatus.

By contrast, the correction time is long for the method of driving the correction lens of the projection optics along the optic axis and for the method of changing over the scanning speed of the movable stage.

On the other hand, correction precision is excellent for the method of driving the correction lens of the projection optics along the optic axis and for the method of changing over the wavelength of the light source.

In particular, the method of changing over the wavelength of the light source makes it possible to correct the image-formation characteristic (e.g., focus, magnification, distortion, etc.) most effectively by changing over the wavelength.

By contrast, the method of driving the movable stage along the optic axis of the projection optics and the method of changing over the scanning speed of the movable stage result in some slight decline in correction precision.

In the correction of the image-formation characteristic that accompanies a change in air pressure during exposure processing, the exposure processing can be optimized taking throughput or correction precision into consideration and selecting a correction method that conforms to the amount of change in air pressure. For example, when the amount of change in air pressure is large, the correction method having high correction precision is selected. Also, when the amount of change in air pressure is small, the correction method whose correction time is short is selected.

The criteria for selecting the correction method will now be described.

For example, in a case where it is necessary to assure focal depth at the time of exposure, such as in a contact-hole exposure process, a correction method that stresses correction precision is selected even if throughput is sacrificed somewhat.

In a case in which focal depth at the time of exposure is assured to some extent, as in a rough-layer exposure process, a correction method that stresses throughput is selected even if correction precision is sacrificed somewhat.

Next, the change in image-formation characteristic ascribable to a change in air pressure is corrected based upon the correction method selected at step S503 (step S504).

Exposure processing of the shot is executed following the end of correction of the change in image-formation characteristic performed at step S504 (step S505).

When exposure of the shot ends, it is determined whether the exposure of all wafers has ended (step S506). If the exposure of all shots has ended, then exposure processing is exited. If unexposed shots remain, then control returns to step S501 and processing for the next exposure shot begins.

In accordance with the fourth embodiment of the present invention, exposure processing is optimized by selecting a correction method that corrects for a change in image-formation characteristic ascribable to a change in air pressure during exposure processing.

In a case where the focus calibration described in the first to third embodiments is carried out, a fifth correction method of correcting the focal-point position is included in addition to the first to fourth correction methods described above. In this case, the fifth correction method is selected in the focus-calibration operation and any of the first to fourth correction methods is selected in the correction operation performed for each shot exposure.

(Fifth Embodiment)

Figure 6:
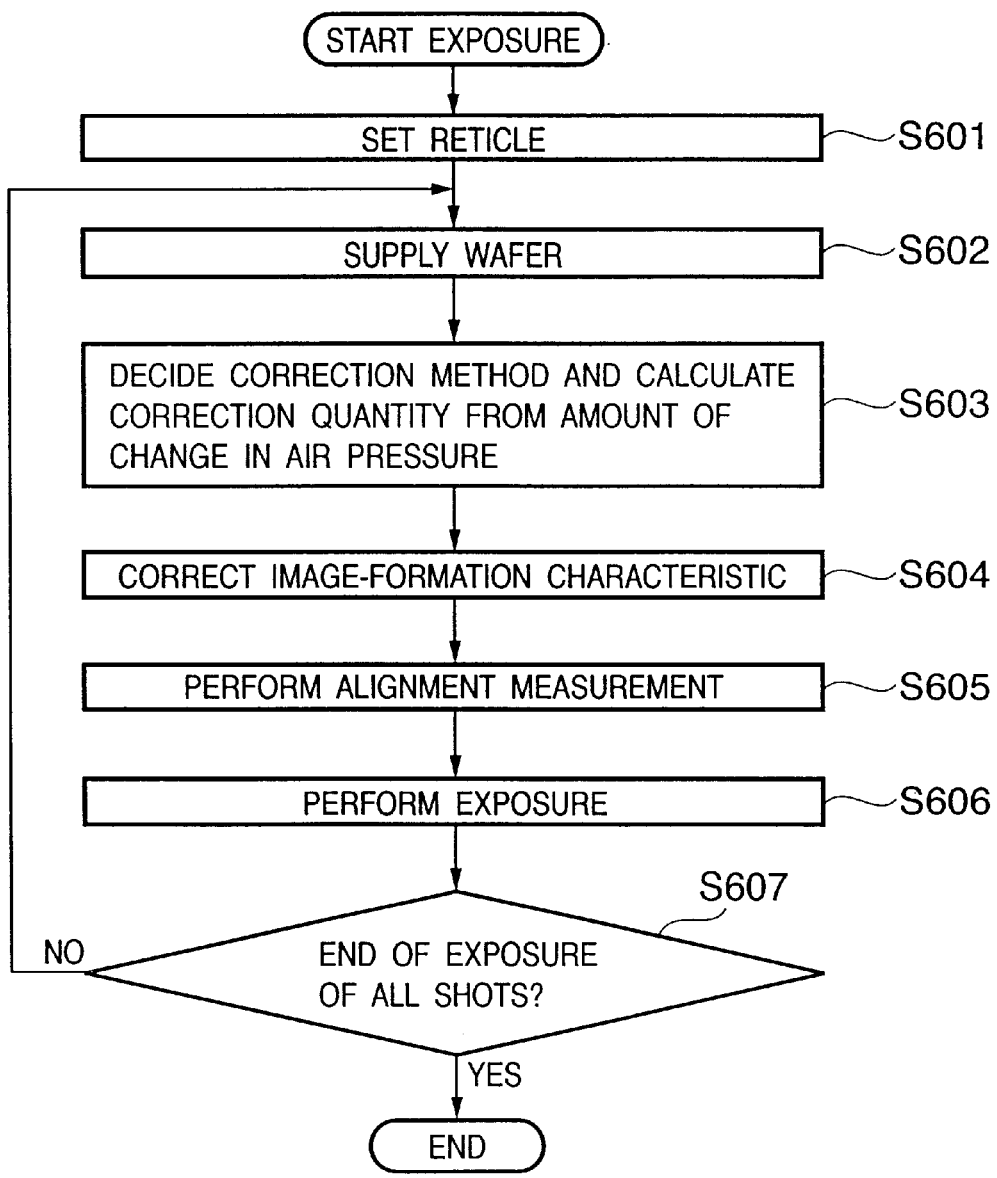
FIG. 6 is a flowchart illustrating a sequence for carrying out a pressure correction during operation of an exposure apparatus according to a fifth embodiment of the present invention.
Figure 7:
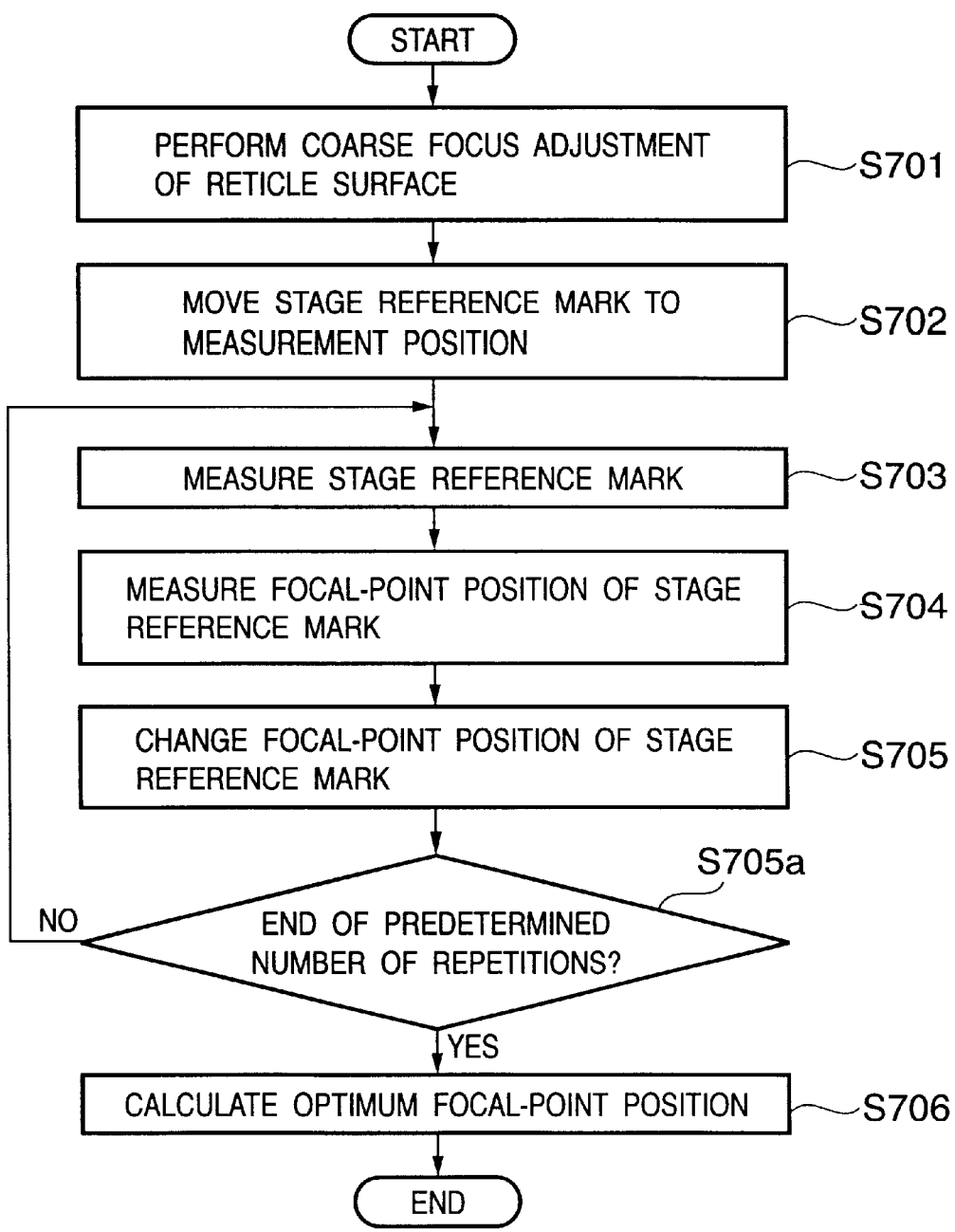
FIG. 7 is a flowchart illustrating the sequence of focus calibration according to an example of the prior art.

A fifth embodiment of the present invention will now be described. FIG. 6 is a flowchart of processing executed during operation of the apparatus in the fifth embodiment.

During operation of the apparatus, the reticle used in a job is set when the job starts (step S601).

Next, a wafer is supplied at step S602. The amount of change in atmospheric pressure or ambient air pressure within the apparatus is obtained after the wafer is supplied and then the amount of correction and correction method are decided upon based upon the amount of change (step S603).

The value of the air pressure prevailing after the supply of the wafer is read in by the barometer 80 and the difference between the value of air pressure read in and the value of air pressure that prevailed before the correction performed previously based upon the amount of change in air pressure may be used as the amount of change in atmospheric pressure or ambient air pressure within the apparatus. For example, the difference between the value of the air pressure read in and the value of the air pressure that prevailed when the wavelength of the light source was changed over previously may be used, or the difference between the value of the air pressure read in and the value of the air pressure that prevailed when the correction lens was driven previously may be used.

An amount of correction that corrects for the amount of change in image-formation characteristic ascribable to a change in the air pressure is calculated based upon the calculated amount of change in the air pressure and then the method of correcting the image-formation characteristic is selected.

Among the first to fourth correction methods described in the fourth embodiment, either one of the second and third correction methods mentioned below can be used as the method of correcting the image-formation characteristic in this embodiment:

1. driving the correction lens of the projection optics along the optic axis (second correction method), and
2. changing over the wavelength of the light source (third correction method).

Although the first correction method can be used, the first correction method is excluded from choices because the correction precision is important in step S603.

The image-formation characteristic is corrected at step S604. Since only the two choices mentioned are available as methods of correcting the image-formation characteristic after supply of the wafer, it will suffice to decide the correction method from Table 3 from the standpoints of correction time and correction precision.

Since it is obvious from Table 3 that correction precision is the same regardless of which correction method is used, it will suffice to decide the correction method by taking note of the correction time. However, the correction times are long for both the method of driving the correction lens of the projection optics along the optic axis and the method of changing over the wavelength of the light source. In such a case, therefore, it will suffice to select the method through which corrective drive can be implemented by processing executed in parallel with subsequent processing (alignment processing of step S605 in this case). It should be noted that the amount of correction is calculated in conformity with the correction method decided.

For example, the amount of correction calculated in a case in which the correction method is to drive the correction lens of the projection optics along the optic axis is the amount by which the correction lens is driven. Accordingly, the value obtained by converting the amount of change in air pressure to an amount of drive of the correction lens is adopted as the amount of correction.

Further, the amount of correction calculated in a case in which the correction method is to change over the wavelength of the light source drive is the wavelength value to be changed. Accordingly, the value obtained by converting the amount of change in air pressure to the wavelength value of the light source is adopted as the correction value.

Correction of the image-formation characteristic that accompanies a change in air pressure is carried out in accordance with the amount of correction and the correction method decided at step S603 (step S604).

Next, an alignment measurement is made at step S605. During the alignment measurement of step S605, it will suffice to perform the correction by any one of the methods set forth in the first to third embodiments. In a case in which atmospheric pressure or ambient air pressure within the apparatus undergoes a large amount of fluctuation during the alignment measurement of step S605, a correction commensurate with the change in the image-formation characteristic that accompanies the change in air pressure may be performed using the processing of steps S603 and S604.

This is followed by performing exposure at step S606. During the exposure processing of step S606, it will suffice to perform the correction by the method set forth in the fourth embodiment. In a case in which atmospheric pressure or ambient air pressure within the apparatus undergoes a large amount of fluctuation during the exposure processing of step S606, a correction commensurate with the change in the image-formation characteristic that accompanies the change in air pressure may be performed using the processing of steps S603 and S604.

When exposure of the shot ends, it is determined whether the exposure of all wafers has ended (step S607). If the exposure of all shots has ended, then exposure processing is exited. If unexposed shots remain, then control returns to step S602 and processing for the next exposure shot begins. The foregoing is processing executed during operation of the apparatus.

In the fifth embodiment, a correction commensurate with the amount of change in the image-formation characteristic ascribable to a change in atmospheric pressure or ambient air pressure within the apparatus is performed during the alignment measurement of step S605 and exposure processing of step S606 after supply of the wafer at step S602.

In this embodiment, the timing of the correction commensurate with the amount of change in the image-formation characteristic ascribable to a change in atmospheric pressure or ambient air pressure within the apparatus is limited to after supply of the wafer. However, the correction may, of course, be applied at any desired timing (e.g., when the fluctuation in value of the air pressure is large).

In the correction of the image-formation characteristic that accompanies a change in air pressure during exposure processing, the exposure processing can be optimized taking throughput or correction precision into consideration and selecting a correction method that conforms to the amount of change in air pressure.

In accordance with the fifth embodiment of the present invention, exposure processing is optimized by selecting the method of correcting for the change in image-formation characteristic ascribable to a change in air pressure during operation of the apparatus.

In a case wherein it is possible to apply the correction described in the first to fourth embodiments, the exposure apparatus is equipped with all of the first to fifth correction methods described in the fourth embodiment, the fifth correction method is selected at the time of focus calibration, any one of the first to fourth correction methods is selected at the end of shot exposure (or at the start thereof), and the second or third correction method is selected at the time of wafer exchange.

(Embodiment of A Semiconductor Production System)

Described next will be an example of a system for producing semiconductor devices (e.g., semiconductor chips such as ICs and LSI chips, liquid crystal panels, CCDs, thin-film magnetic heads and micromachines, etc.) utilizing the apparatus or method according to the present invention. This system utilizes a computer network outside the semiconductor manufacturing plant to provide troubleshooting and regular maintenance of manufacturing equipment installed at the manufacturing plant and to furnish maintenance service such as the provision of software.

Figure 8:
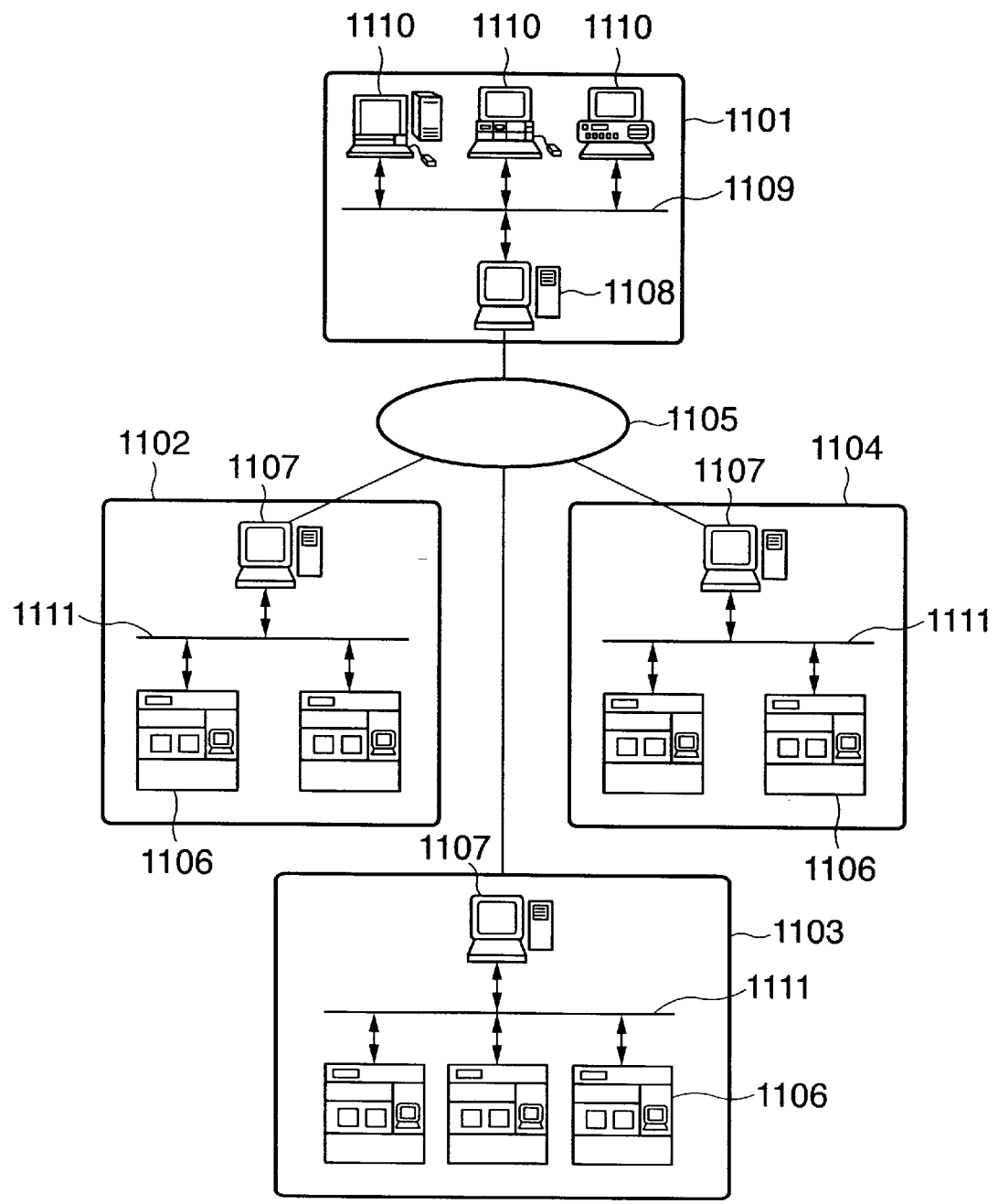
FIG. 8 is a diagram illustrating a system for manufacturing semiconductor devices using an apparatus according to the present invention.

FIG. 8 illustrates the overall system as seen from a certain angle. The system includes the business office 1101 of the vendor (e.g., equipment supplier) that provides the equipment for manufacturing semiconductor devices. Semiconductor manufacturing equipment for performing various processes used in a semiconductor manufacturing plant is assumed to be the manufacturing equipment. Examples of the equipment are pre-treatment equipment (e.g., lithographic equipment such as exposure equipment, resist treatment equipment, thin-film equipment smoothing equipment, etc.) and post-treatment equipment (e.g., assembly equipment, inspection equipment, etc.). The business office 1101 includes a host management system 1108 for providing a manufacturing-equipment maintenance database, a plurality of control terminal computers 1110, and a local-area network (LAN) 1109 for connecting these components into an intranet. The host management system 1108 has a gateway for connecting the LAN 1109 to the Internet 1105, which is a network external to the business office 1101, and a security function for limiting access from the outside.

Numerals 1102 to 1104 denote manufacturing plants of semiconductor makers which are the users of the manufacturing equipment. The manufacturing plants 1102 to 1104 may be plants belonging to makers that differ from one another or plants belonging to the same maker (e.g., pretreatment plants, post-treatment plants, etc.). Each of the plants 1102 to 1104 is provided with a plurality of pieces of manufacturing equipment 1106, a local-area network (LAN) 1111, which connects these pieces of equipment to construct an intranet, and a host management system 1107 serving as a monitoring unit for monitoring the status of operation of each piece of manufacturing equipment 1106. The host management system 1107 provided at each of the plants 1102 to 1104 has a gateway for connecting the LAN 1111 in each plant to the Internet 1105 serving as the external network of the plants. As a result, it is possible for the LAN of each plant to access the host management system 1108 on the side of the vendor 1101 via the Internet 1105. By virtue of the security function of the host management system 1108, users allowed to access the host management system 1108 are limited. More specifically, status information (e.g., the condition of manufacturing equipment that has malfunctioned), which indicates the status of operation of each piece of manufacturing equipment 1106, can be reported from the plant side to the vendor side. In addition, information in response to such a notification (e.g., information specifying how to troubleshoot the problem, troubleshooting software and data, etc.), as well as the latest software and maintenance information such as help information, can be acquired from the vendor side. A communication protocol (TCP/IP), which is used generally over the Internet, is employed for data communication between the plants 1102~1104 and the vendor 1101 and for data communication over the LAN 1111 within each plant. Instead of utilizing the Internet as the external network of a plant, it is also possible to utilize a highly secure leased-line network (e.g., an ISDN) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 9:
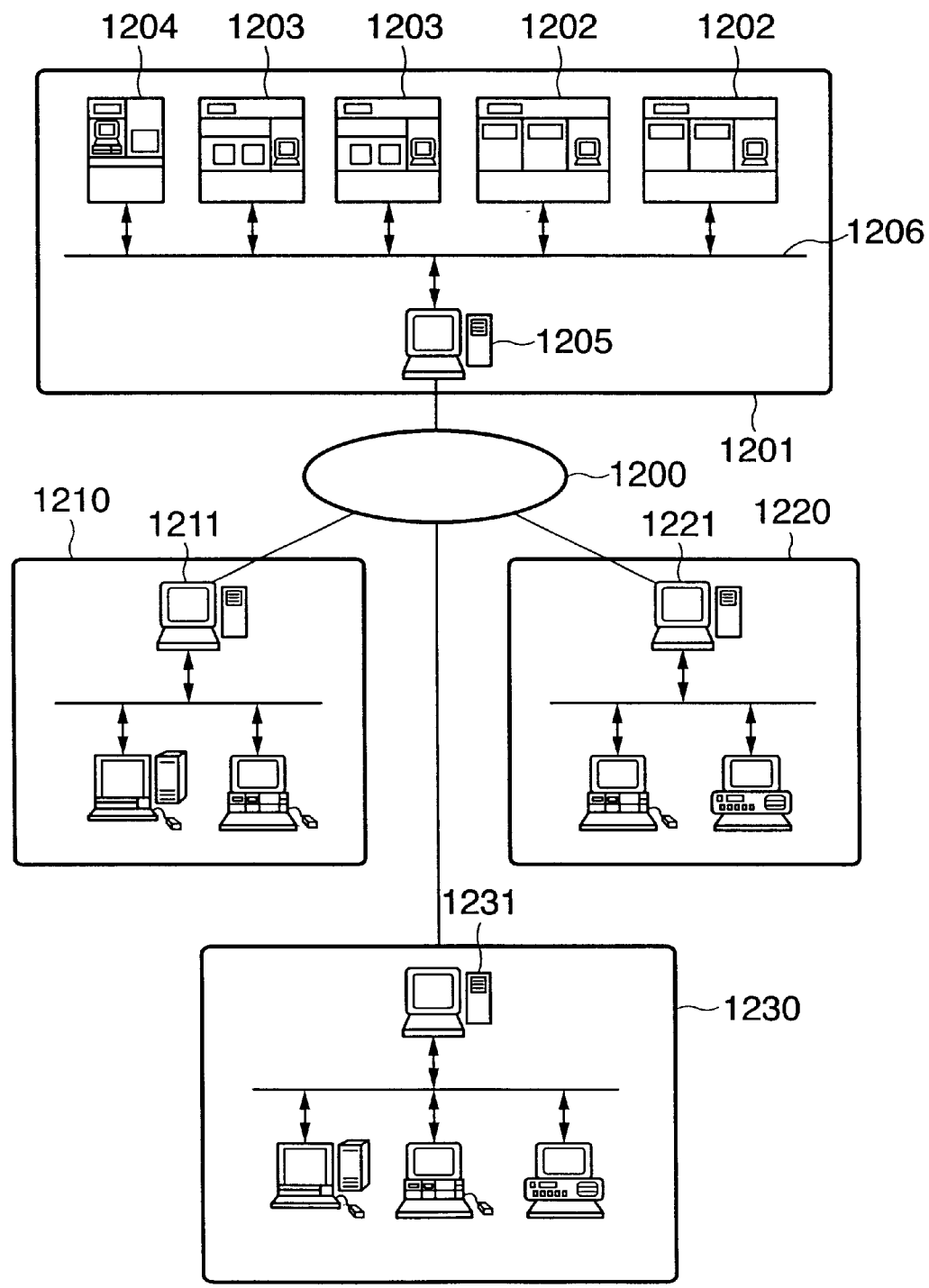
FIG. 9 is a diagram illustrating a system for manufacturing semiconductor devices using an apparatus according to the present invention as seen from another viewpoint.

FIG. 9 is a conceptual view illustrating the overall system of this embodiment as seen from an angle different from that depicted in FIG. 8. In the earlier example, a plurality of user plants each having manufacturing equipment are connected by an external network to the management system of the vendor that provided the manufacturing equipment, and information concerning the production management of each plant and information concerning at least one piece of manufacturing equipment is communicated by data communication via the external network. In the present example, on the other hand, a plant having manufacturing equipment provided by a plurality of vendors is connected by an outside network to management systems of respective ones of the vendors of these plurality of pieces of manufacturing equipment, and maintenance information for each piece of manufacturing equipment is communicated by data communication. As shown in the drawing, the system includes a manufacturing plant 1201 of the user of the manufacturing equipment (e.g., the maker of semiconductor devices). The manufacturing line of this plant includes manufacturing equipment for implementing a variety of processes. Examples of such equipment are exposure equipment 1202, resist treatment equipment 1203 and thin-film treatment equipment 1204. Though only one manufacturing plant 1201 is shown in FIG. 9, in actuality, a plurality of these plants are networked in the same manner. The pieces of equipment in the plant are interconnected by a LAN 1206 to construct an intranet and the operation of the manufacturing line is managed by a host management system 1205.

The business offices of vendors (e.g., equipment suppliers), such as an exposure equipment maker 1210, a resist treatment equipment maker 1220 and a thin-film treatment equipment maker 230 have host management systems 1211, 1221, 1231, respectively, for performing remote maintenance of the equipment they have supplied. These have maintenance databases and gateways to the outside network, as described earlier. The host management system 1205 for managing each piece of equipment in the manufacturing plant of the user is connected to the management systems 1211, 1221, 1231 of the vendors of these pieces of equipment by the Internet or leased-line network serving as an external network 1200. If any of the series of equipment in the manufacturing line malfunctions, the line ceases operating. However, this can be dealt with rapidly by receiving remote maintenance from the vendor of the faulty equipment via the Internet 1200, thereby making it possible to minimize line downtime.

Figure 10:
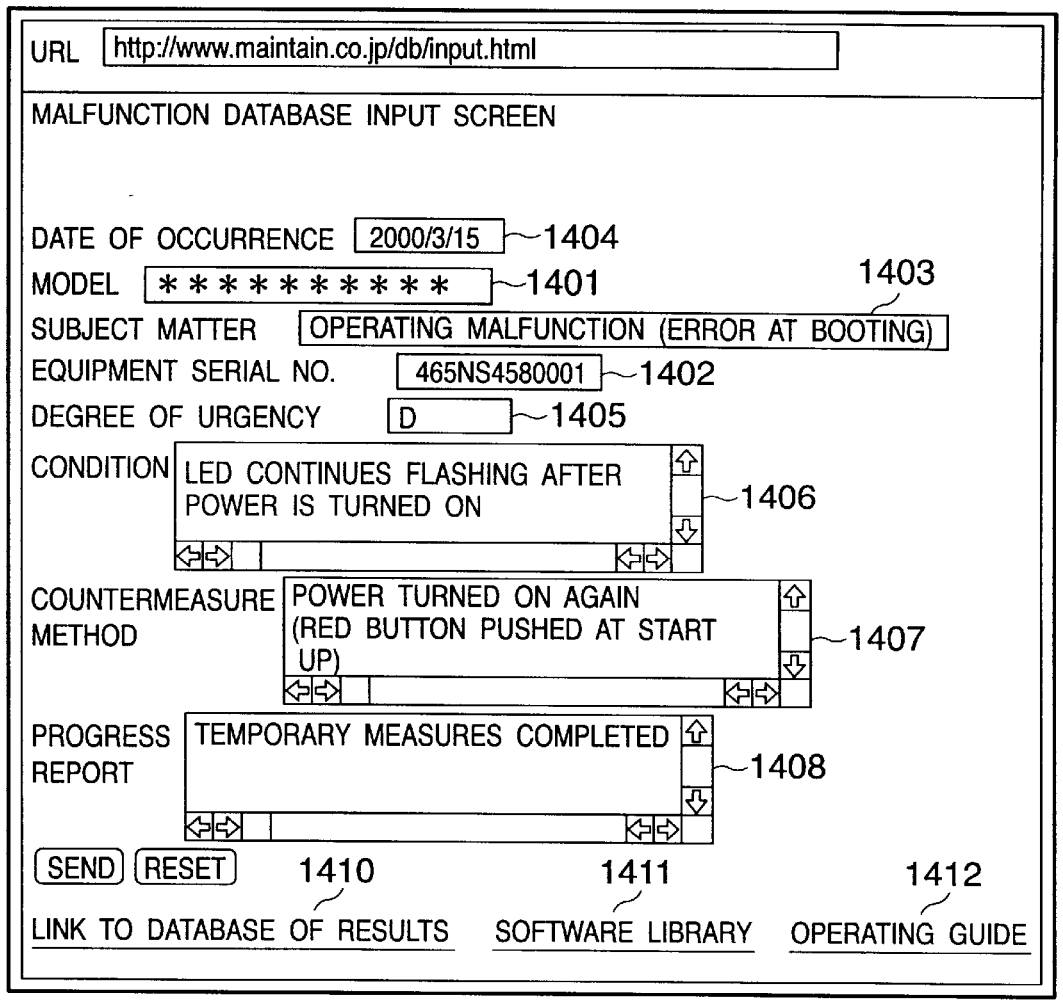
FIG. 10 is a diagram illustrating a specific example of a user interface.

Each piece of manufacturing equipment installed in the semiconductor manufacturing plant has a display, a network interface and a computer for executing network-access software and equipment operating software stored in a storage device. The storage device can be an internal memory or a hard disk or a network file server. The software for network access includes a special-purpose or general-purpose Web browser and presents a user interface, which has a screen of the kind shown by way of example in FIG. 10, on the display. The operator managing the manufacturing equipment at each plant enters information at the input items on the screen while observing the screen. The information includes model 1401 of the manufacturing equipment, its serial number 1402, subject matter 1403 of the problem, its date of occurrence 1404, degree of urgency 1405, the particular condition 1406, countermeasure method 1407 and progress report 1408. The entered information is transmitted to the maintenance database via the Internet. The resulting appropriate maintenance information is sent back from the maintenance database and is presented on the display screen. The user interface provided by the Web browser implements hyperlink functions 1410, 1411, 1412 as illustrated and enables the operator to access more detailed information for each item, to extract the latest version of software, which is used for the manufacturing equipment, from a software library provided by the vendor, and to acquire an operating guide (help information) for reference by the plant operator. Here, the maintenance information provided by the maintenance database also includes the above-described information relating to the present invention, and the software library also provides the latest software for implementing the present invention.

Figure 11:
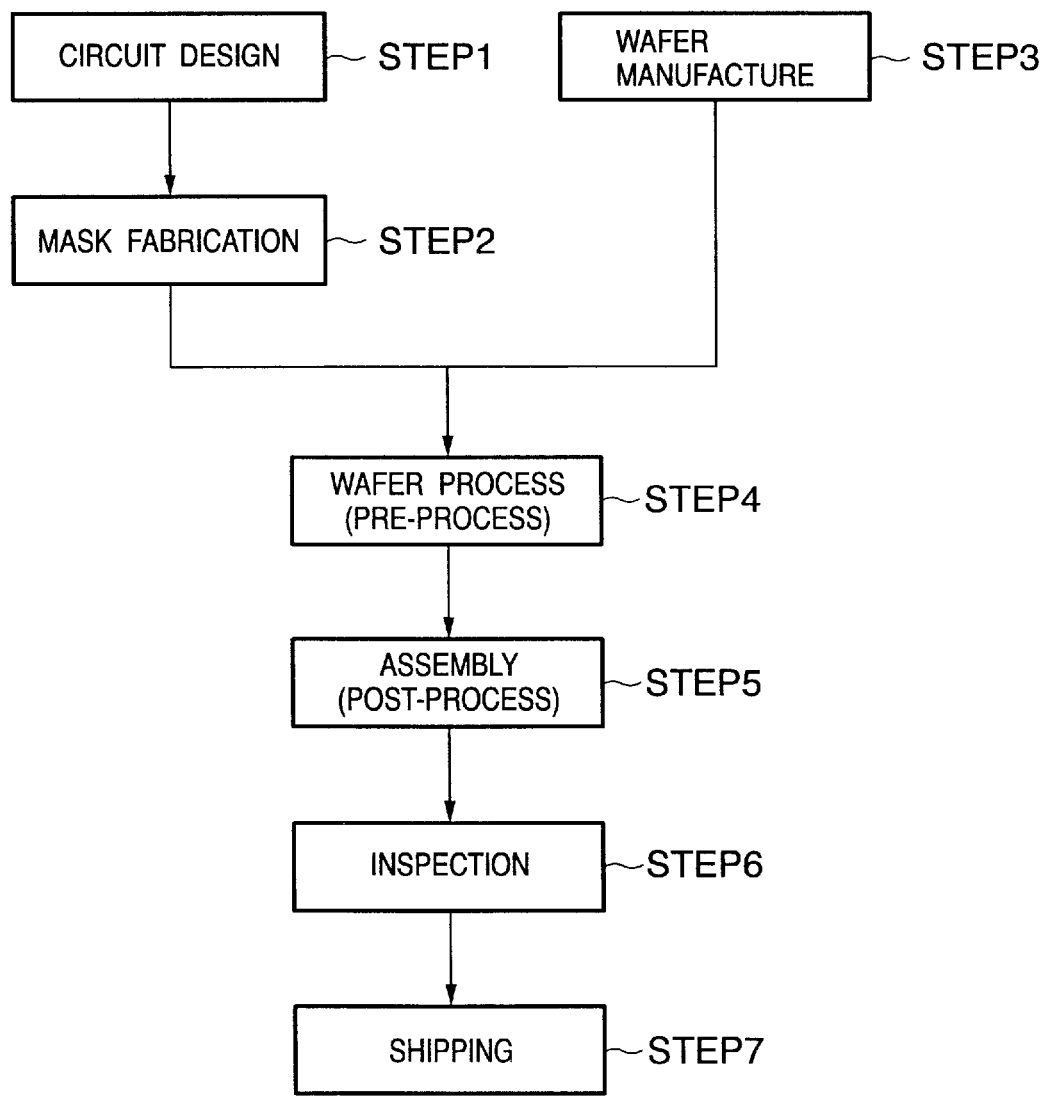
FIG. 11 is a diagram useful in describing the flow of a process for manufacturing semiconductor devices.

A process for manufacturing a semiconductor device utilizing the production system set forth above will now be described. FIG. 11 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7). The pre- and post-treatments are performed at separate special-purpose plants. Maintenance is carried out on a per-plant basis by the above-described remote maintenance system. Further, information for production management and equipment maintenance is communicated by data communication between the pre- and post-treatment plants via the Internet or leased-line network.

Figure 12:
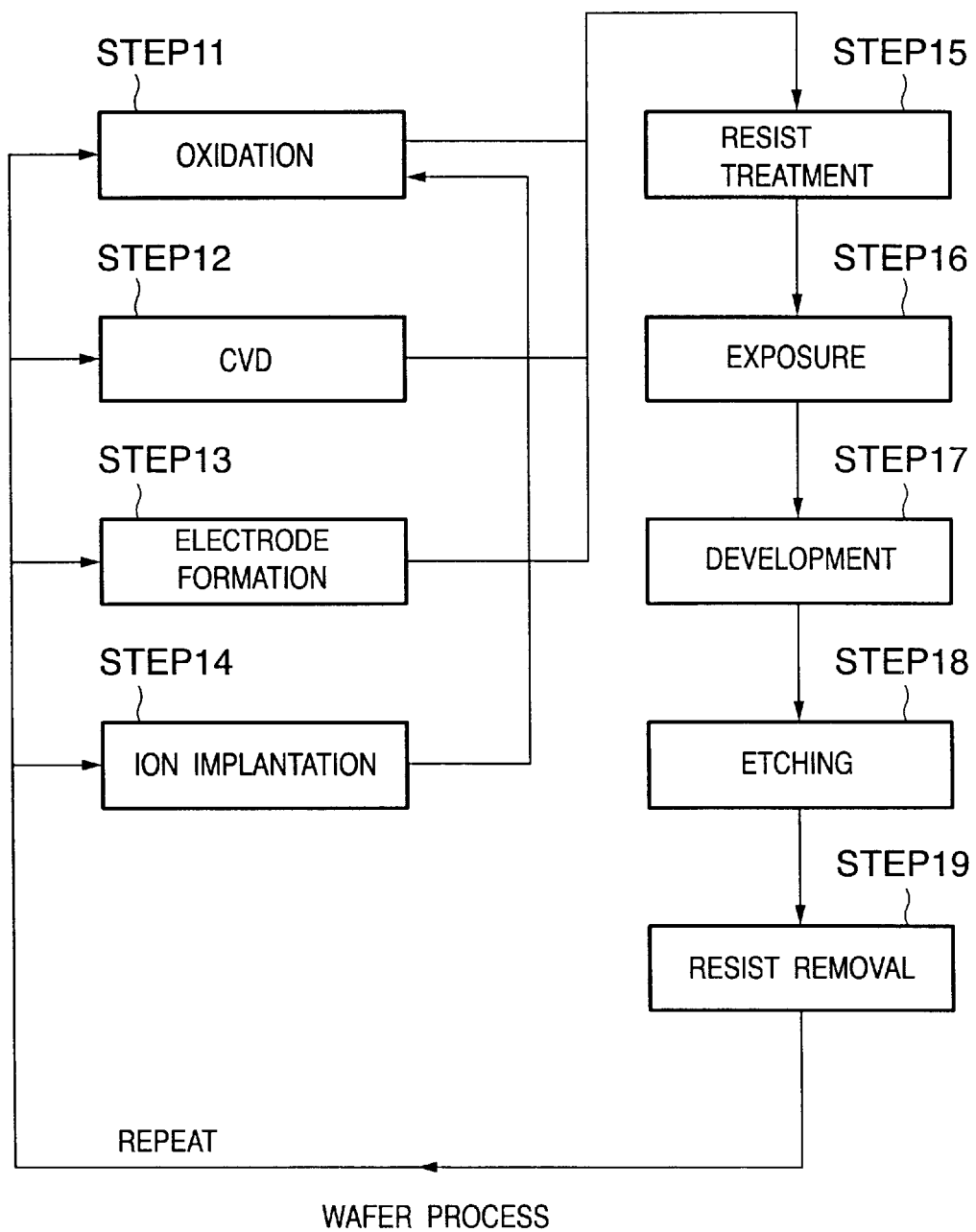
FIG. 12 is a diagram useful in describing a wafer process.

FIG. 12 is a flowchart for illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, as described above, the present invention makes it possible to correct for a change in focal-point position due to a change in air pressure during execution of focus calibration. As a result, measurement precision of focus calibration is improved and a decline in throughput is prevented because the minimum necessary correction can be applied at the appropriate timing.

Further, in accordance with another aspect of the present invention, when a correction commensurate with a change in image-formation characteristic ascribable to a change in air pressure is applied, the correction method is changed over from the standpoint of, e.g., throughput and correction precision, thereby making it possible to optimize the apparatus.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for projecting a pattern on a reticle onto a substrate via an optical system, said apparatus comprising:

a focus detection system which detects a position of the substrate in a direction of an optical axis of the optical system;

a barometer for measuring at least one of the atmospheric pressure and ambient air pressure within the apparatus;

calibration means for calibrating said focus detection system; and correction means for acquiring a correction quantity, during execution of the calibration, which is for correcting for a change in an image-formation characteristic ascribable to a fluctuation in air pressure in said apparatus, based upon a result of a measurement performed by said barometer during execution of the calibration, and correcting operation of said calibration means using the correction quantity.

2. An apparatus according to claim 1, wherein said calibration means moves a reference mark to a plurality of positions by moving a substrate stage along the optical axis, and detects the reference mark via the optical system at each of the plurality of positions, thereby deciding a focal-point position of the optical system, and calibrating said focus detection system based upon the focal-point position, and said correction means corrects operation of said calibration means at each of the plurality of positions.

3. An apparatus according to claim 2, wherein said correction means acquires the correction quantity at each of the plurality of positions based upon a fluctuation in air pressure at this time, and corrects the plurality of positions by the correction quantities acquired, respectively.

4. An apparatus according to claim 3, wherein said calibration means calculates the focal-point position based upon position data of each of the plurality of positions and a result of a reference-mark detection corresponding to the position data, and said correction means corrects the position data for calculating the focal-point position.

5. An apparatus according to claim 3, wherein said correction means corrects a destination to which the reference mark is moved by said calibration means.

6. An apparatus according to claim 3, wherein said correction means causes a correction quantity, which corresponds to a fluctuation in air pressure, to be reflected in a wavelength of a light source used in detecting the reference mark.

7. An apparatus according to claim 3, wherein said correction means changes a position of a correction lens in the optical system based upon a correction quantity corresponding to a fluctuation in air pressure.

8. A method of manufacturing a device, said method comprising steps of:

placing a group of manufacturing equipment for performing various processes, including the exposure apparatus set forth in claim 1, in a plant for manufacturing devices; and manufacturing a device by performing a plurality of processes using this group of manufacturing equipment.

9. A method of manufacturing a device, said method comprising steps of:

providing a reticle to an exposure apparatus defined in claim 1;

providing a substrate to the exposure apparatus; and exposing the substrate to a pattern formed on the reticle, using the exposure apparatus.

10. An exposure apparatus for projecting a pattern on a reticle onto a substrate via an optical system, said apparatus comprising:

a barometer for measuring at least one of atmospheric pressure and ambient air pressure within said apparatus;

a plurality of correction means, each of which corrects an exposure operation in order to correct for an amount of change of an image-formation characteristic ascribable to a fluctuation in air pressure, based upon a result of a measurement by said barometer; and selection means for selecting one of said plurality of correction means to perform the correction of an exposure operation.

11. An apparatus according to claim 10, wherein said selection means selects one of the plurality of correction means based upon at least one of throughput criteria and correction-precision criteria.

12. An apparatus according to claim 10, wherein said plurality of correction means includes at least one of:

first correction means for moving the reticle or substrate along the optical axis based upon a result of a measurement by said barometer in order to correct for an amount of change of an image-formation characteristic ascribable to a fluctuation in air pressure;

second correction means for moving a correction lens of the optical system along the optical axis based upon a result of a measurement by said barometer in order to correct for an amount of change of an image-formation characteristic ascribable to a fluctuation in air pressure;

third correction means for changing a wavelength of a light source based upon a result of measurement by said barometer in order to correct for an amount of change of an image-formation characteristic ascribable to a fluctuation in air pressure; and fourth correction means for varying a scanning speed of a movable stage which moves a reticle or a substrate based upon the amount of fluctuation in air pressure.

13. An apparatus according to claim 12, wherein said selection means selects one of the first to fourth correction means on a per-shot-exposure basis.

14. An apparatus according to claim 12, wherein said selection means selects one of the second and third correction means whenever a wafer is exchanged.

15. A method of manufacturing a device, said method comprising steps of:

providing a reticle to an exposure apparatus defined in claim 10;

providing a substrate to the exposure apparatus; and exposing the substrate to a pattern formed on the reticle, using the exposure apparatus.

16. An exposure apparatus for projecting a reticle pattern onto a substrate via an optical system, said apparatus comprising:

a substrate stage for holding and moving a substrate, said substrate stage having a reference plate and moving the reference plate to a plurality of points along an optical axis of the optical system;

a first detection system for detecting a position of the reference plate in the optical axis direction at each of the plurality of points by using light flux;

a second detection system for, at each of the plurality of points, irradiating light flux through the optical system on the reference plate, and detecting an amount of reflection light from the reference plate;

a barometer for measuring atmospheric pressure or ambient air pressure within said apparatus, during movement of the reference plate to the plurality of points; and calibration means for calibrating said first detection system based on detection results of said first detection system and said second detection system at each of the plurality of points and a measurement result of said barometer.

17. An exposure apparatus for projecting a reticle pattern onto a substrate via an optical system, said apparatus comprising:

a substrate stage for holding and moving a substrate, said substrate stage having a reference plate and moving the reference plate to a plurality of points along an optical axis of the optical system;

a first detection system for detecting a position of the reference plate in the optical axis direction at each of the plurality of points by using light flux;

a second detection system for, at each of the plurality of points, detecting a contrast of an image of a mark set on the reference plate by using light flux through the optical system;

a barometer for measuring atmospheric pressure or ambient air pressure within said apparatus more than once, during movement of the reference plate to the plurality of points; and calibration means for calibrating said first detection system based on detection results of said first detection system and said second detection system at the plurality of points and a measurement result of said barometer.

18. An exposure apparatus for exposing a substrate to a pattern through an optical system, said apparatus comprising:

a position detection system which detects a position of the substrate in a direction of an optical axis of the optical system;

a focus detection system which detects a position, in the direction of the optical axis, at which an image of the pattern is to be formed;

a barometer which detects a barometric pressure; and a calibration system which calibrates said position detection system based on outputs of said position detection system, said focus detection system and said barometer.

19. A device manufacturing method comprising:

a step of exposing a substrate to a pattern using an exposure apparatus defined in claim 18.

20. An exposure apparatus for exposing a substrate to a pattern through an optical system, said apparatus comprising:

an exposure system which exposes the substrate to the pattern, and includes a plurality of subsystems, each of which corrects a characteristic of an image to be formed on the substrate;

a barometer which detects a barometric pressure, and a control system which selects one of said plurality of subsystems, and calculates a correction amount, by which said selected one of the plurality of subsystems corrects the characteristic, based on a detection result of said barometer.

21. A device manufacturing method comprising:

a step of exposing a substrate to a pattern using an exposure apparatus defined in claim 20.

22. An exposure apparatus for exposing a substrate to a pattern through an optical system, said apparatus comprising:

a focusing system which detects a position of the substrate in a direction of an optical axis of the optical system, and positions the substrate based on the detected position of the substrate;

a focus detection system which detects a position, in the direction of the optical axis, at which an image of the pattern is to be formed;

a barometer which detects a barometric pressure; and a calibration system which calibrates said focusing system based on outputs of said focus detection system and said barometer.

23. A device manufacturing method comprising:

a step of exposing a substrate to a pattern using an exposure apparatus defined in claim 22.

* * * * *